United States Patent
Cheng et al.

(10) Patent No.: US 6,749,737 B2
(45) Date of Patent: Jun. 15, 2004

(54) METHOD OF FABRICATING INTER-LAYER SOLID CONDUCTIVE RODS

(75) Inventors: Jao-Chin Cheng, Hsinchu (TW);
Chang-Chin Hsieh, Taipei (TW);
Chih-Peng Fan, Taipei Hsien (TW);
Chih-Hao Yeh, Taoyuan (TW)

(73) Assignee: Unimicron Taiwan Corp., Taoyuan Hsien (TW)

( * ) Notice: Subject to any disclaimer, the term of this patent is extended or adjusted under 35 U.S.C. 154(b) by 270 days.

(21) Appl. No.: 09/927,723

(22) Filed: Aug. 10, 2001

(65) Prior Publication Data

US 2003/0029729 A1 Feb. 13, 2003

(51) Int. Cl.[7] .............................. C25D 5/02; C25D 5/48; C25D 5/52
(52) U.S. Cl. .................. 205/125; 205/221; 205/222
(58) Field of Search ...................... 205/125, 221, 205/222

(56) References Cited

U.S. PATENT DOCUMENTS 5,567,329 A * 10/1996 Rose et al. .................... 216/18

* cited by examiner

*Primary Examiner*—Edna Wong
(74) *Attorney, Agent, or Firm*—J.C. Patent

(57) ABSTRACT

A method of forming a solid inter-layer conductive rod. A printed circuit board comprising an insulating core layer, a first conductive layer and a second conductive layer is provided. The insulating core layer is sandwiched between the first conductive layer and the second conductive layer. A first opening that exposes a portion of the insulating core layer is formed in the first conductive layer. The exposed insulating core layer is removed by laser drilling to form a second opening that exposes a portion of the second conductive layer. An electroplating process is conducted using the second conductive layer as a negative electrode so that conductive material solidly fills the first opening and the second opening to form a solid conductive rod.

11 Claims, 10 Drawing Sheets ated pad 140 (as shown in FIG. 4*a*) may lead to an over-etching of the copper layer 200 (as shown in FIG. 4*b*). The over-etched copper layer 200 may lead to poor electrical connection or electrical failure. To reduce such connectivity problems, the conventional remedy includes increasing the area of the opening pad 140. However, increasing hole pad area reduces area, utilization of the printed circuit board.

METHOD OF FABRICATING INTER-LAYER SOLID CONDUCTIVE RODS

BACKGROUND OF THE INVENTION

1. Field of Invention

The present invention relates to a method of connecting conductive layers. More particularly, the present invention relates to a method of forming inter-layer solid conductive rods applicable to a printed circuit board (PCB) and an IC carrier.

2. Description of Related Art

In addition to powerful functions, consumers now demand for lighter, thinner, smaller electronic products. Consequently, most electronic products in the market have an ever-increasing level of integration and an increasing number of powerful functions. To correspond to the increasing level of integration and functions, most printed circuit boards have a multiple of layers so that a dense array of electronic devices can be designed over the printed circuit board. An integrated circuit manufacturer not only has to reduce volume occupation of the electronic product and increase area utility, but also has to increase yield in order to reduce production cost.

FIGS. 1*a* and 1*b* are cross-sectional views of a printed circuit board showing a conventional process of forming a through hole connection between two circuit layers. FIGS. 2*b* and 2*c* are cross-sectional views of a printed circuit board showing a conventional process of forming a blind hole connection between two circuit layers. To form a connection between two circuit layers within a printed circuit board, a hole is mechanically drilled or laser-drilled in a location where copper films 200 together with intermediate an insulating core layer 100 overlap. The hole may be a through hole 300 (as shown in FIG. 1*a*) or a blind hole 310 (as shown in FIG. 2*a*). A copper layer serving as a seed layer is formed on the copper films 200 and the interior walls of the hole (300 or 310) by an electroless plating. Thereafter, a copper electroplating is conducted to form a copper layer (as shown in FIGS. 1*b* and 2*b*) over the seed layer. Finally, a centrally hollow conductive copper ring for connecting the electrical circuits on each side of the circuit board and acting as an inter-layer conductive medium is formed.

In the conventional method, the copper layer is formed by connecting the upper and lower conductive layer 200 to a negative electrode and performing an electroplating after the seed layer is formed. Hence, growth rate of the plate layer is fastest on the upper and lower sides of the through hole 300 (FIG. 1*b*) due to easy access of electroplating solution. A consequence of this is that the upper and the tower region of the through hole 300 are likely to be filled first, thereby forming a hollow interior. This also happens to the opening side of the blind hole 310. In brief, the process of forming a seed layer before electroplating produces an inter-layer conductive medium having a hollow center. To minimize such problem in the wire layout, width of an opening pad (Δr n FIG. 3) enclosing the hole is often increased and a connecting patch 410 is formed next to the hole to serve as landing pad for connecting with other layers. Ultimately, efficient utilization of surface area across a printed circuit board is not possible.

In addition, the absence of a solid interior in the inter-layer conductive medium fabricated by a conventional process also leads to other problems. For example, when a circuit pattern is fanned over the copper film 200, a misalignment of the opening pad 140 (as shown in FIG. 4*a*) may In short, a conventional fabrication method produces a hollow conductive metallic ring that leads to a low utilization of printed circuit area and a low yield for the inter-layer conductive connection.

SUMMARY OF THE INVENTION

Accordingly, one object of the present invention is to provide a method of forming a solid inter-layer conductive rod capable of increasing area utilization of a printed circuit board and raising production yield of the inter-layer conductive connection.

To achieve these and other advantages and in accordance with the purpose of the invention, as embodied and broadly described herein, the invention provides a method of forming a solid inter-layer conductive rod. A printed circuit board comprising an insulating core layer, a first conductive layer and a second conductive layer is provided. The insulating core layer is sandwiched between the first conductive layer and the second conductive layer. A first opening that exposes a portion of the insulating core layer is formed in the first conductive layer. The exposed insulating core layer is removed by laser drilling to form a second opening that exposes a portion of the second conductive layer. An electroplating process is conducted using the second conductive layer as a negative electrode so that conductive material solidly fills the first opening and the second opening to form a solid conductive rod.

One major aspect of this invention is the use of the second conductive layer as a negative electrode in the electroplating process. Without passing any electric current to the first conductive layer, conductive material starts to accumulate from the second conductive layer until the first and the second opening are completely filled. Since the upper portion of the opening is not blocked by conductive material early on in the process, a solid conductive rod is ultimately formed.

A second aspect of this invention is that the upper area of the solid conductive rod can be directly used as the conductive pad of a lower layer. There is no need to increase area of the opening pad or to form a connecting patch in neighboring area to serve as a conductive pad. Thus, area utilization of the printed circuit board is improved.

A third aspect of this invention is that conditions for forming a conductive layer over the solid conductive rod by photolithography and etching are less stringent because tolerance for hole pad misalignment is increased and the production of defective inter-layer electrical connection is less frequent. Ultimately, a higher product yield is obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
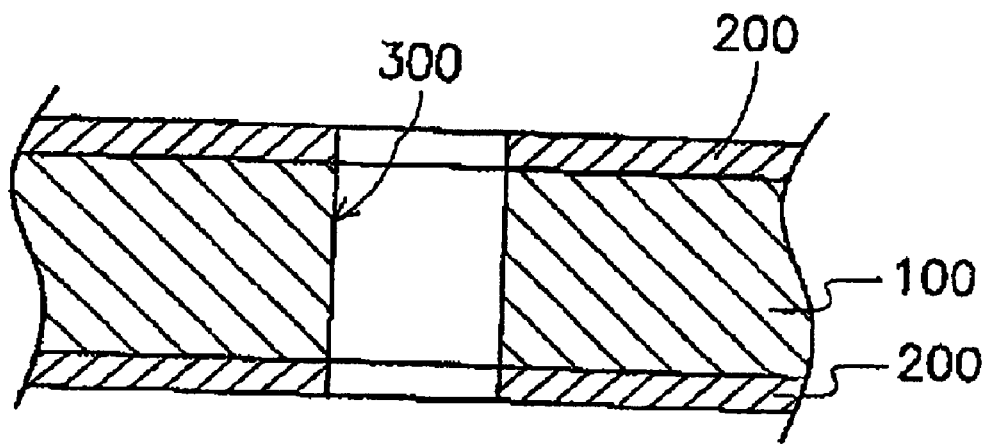
FIGS. 1a and 1b are cross-sectional views of a printed circuit board showing a conventional process of forming a through hole connection between two circuit layers.
Figure 1B:
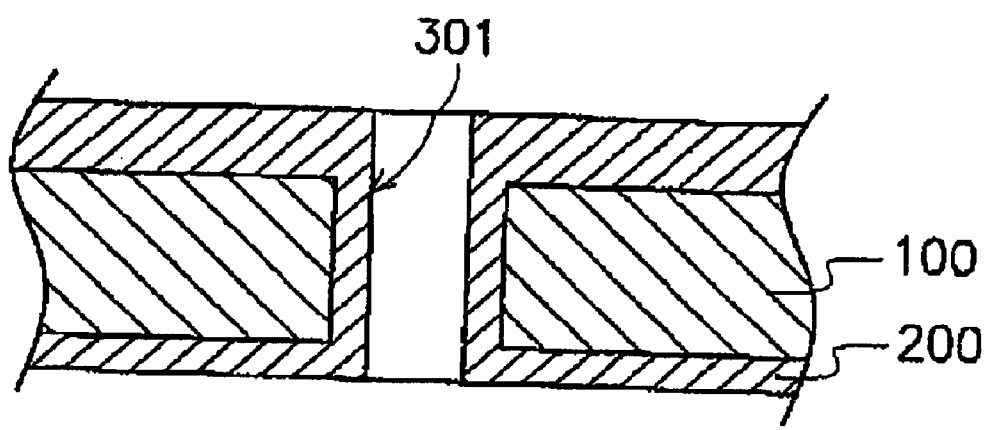
Figure 2A:
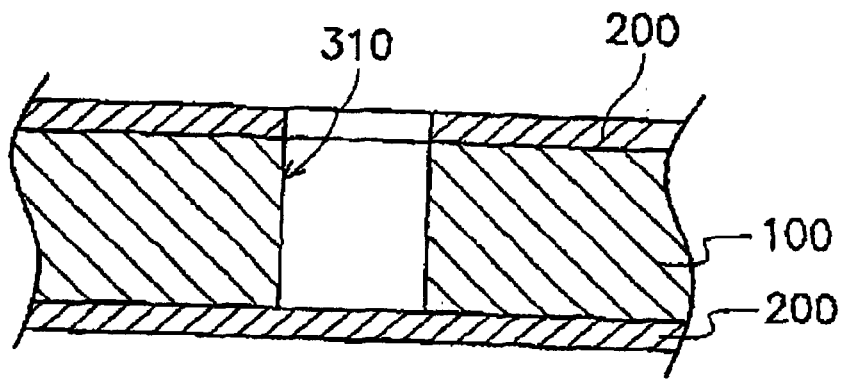
FIGS. 2a and 2b are cross-sectional views of a printed circuit board showing a conventional process of forming a blind hole connection between two circuit layers.
Figure 2B:
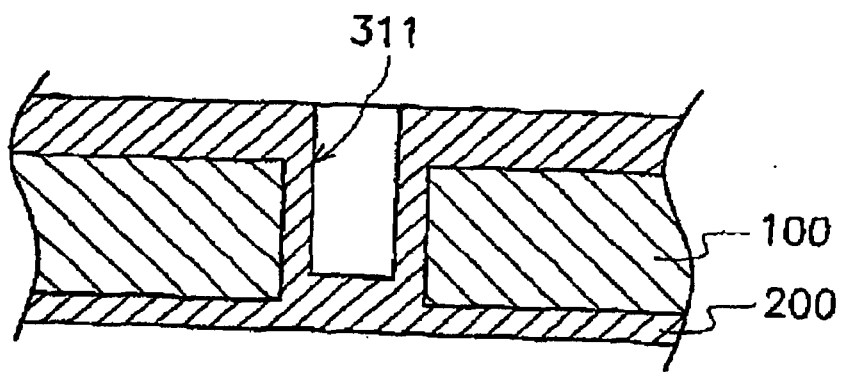
Figure 3:
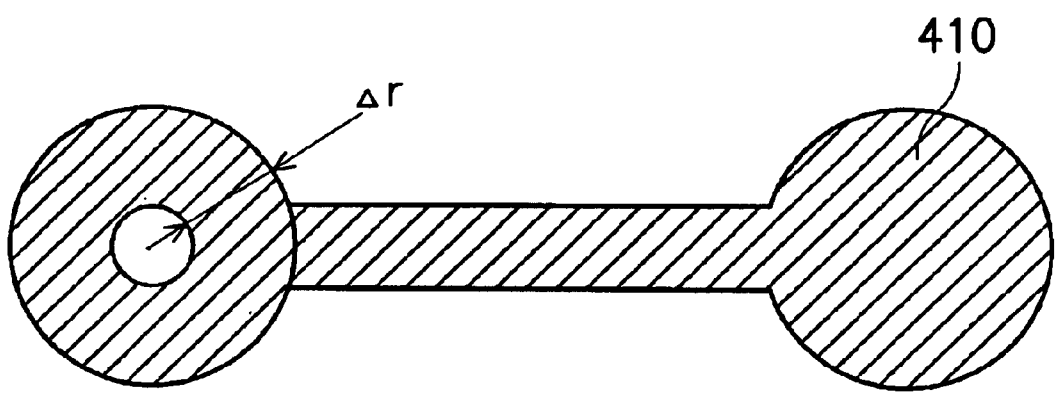
FIG. 3 is a top view showing the conductive copper ring (containing an external conductive pad) formed as shown in FIGS. 1b and 2b.
Figure 4A:
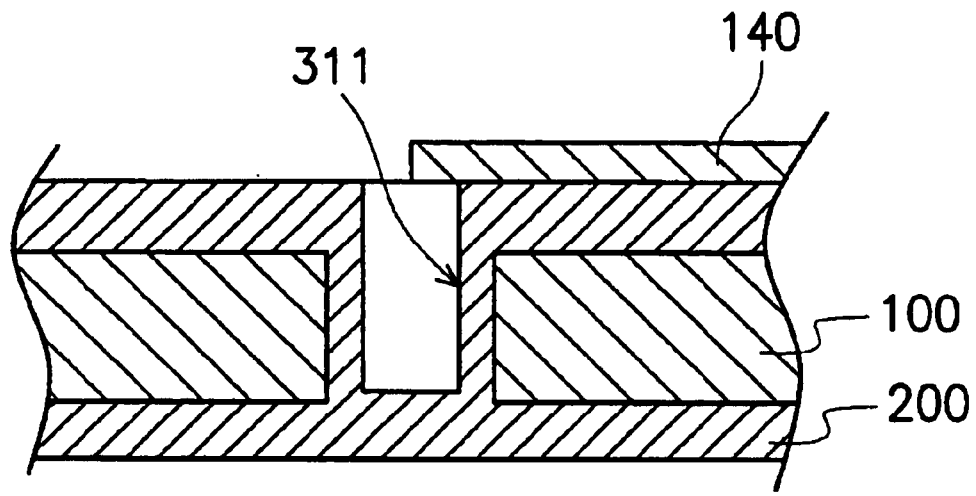
FIGS. 4a and 4b are cross-sectional views showing a defective connection between a hole pad and the conductive copper ring shown in FIG. 2 of after etching due to pattern misalignment.
Figure 4B:
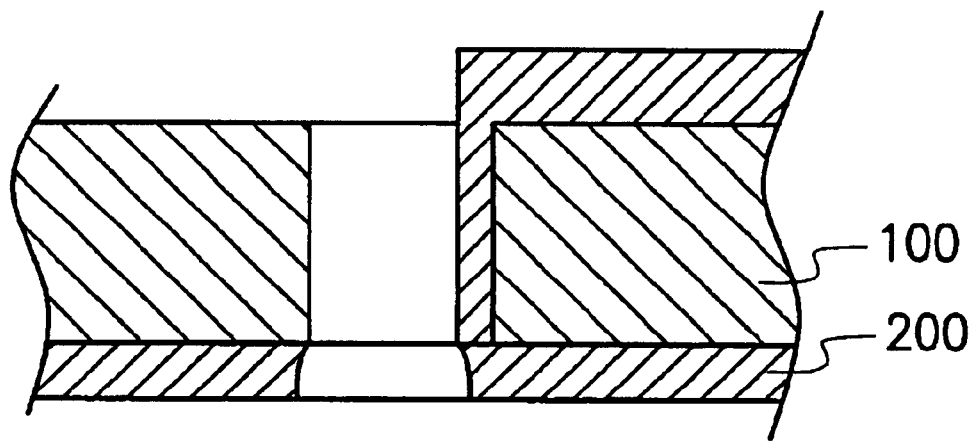

Reference will now be made in detail to the present preferred embodiments of the invention, examples of which are illustrated in the accompanying drawings. Wherever possible, the same reference numbers are used in the drawings and the description to refer to the same or like parts.

Figure 5A:
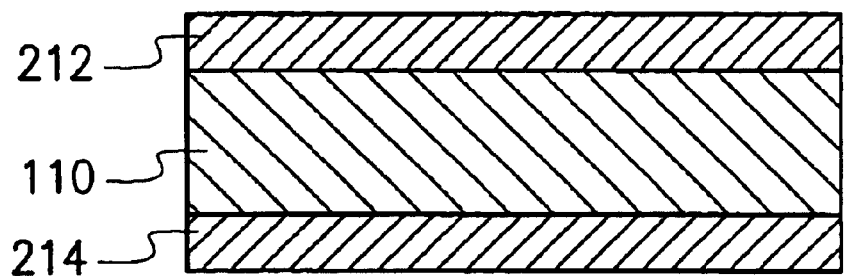
FIGS. 5a through 5h are cross-sectional views showing the progression of steps for forming a solid inter-layer conductive rod in a printed circuit board according to this invention.

FIGS. 5a through 5h are cross-sectional views showing the progression of steps for forming a solid inter-layer conductive rod in a printed circuit board according to this invention. FIG. 6 is a flow chart showing the steps for forming a solid inter-layer conductive rod in a printed circuit board according to one preferred embodiment of this invention. As shown in FIG. 5a, a printed circuit board (step 701 in FIG. 6) comprising a stack of layers, including an insulating core layer 110, a first conductive layer 212 and a second conductive layer 214, is provided. The insulating core layer 110 is between the first conductive layer 212 and the second conductive layer 214. The first conductive layer 212 and the second conductive layer 214 are copper layers, for example.

Figure 5B:
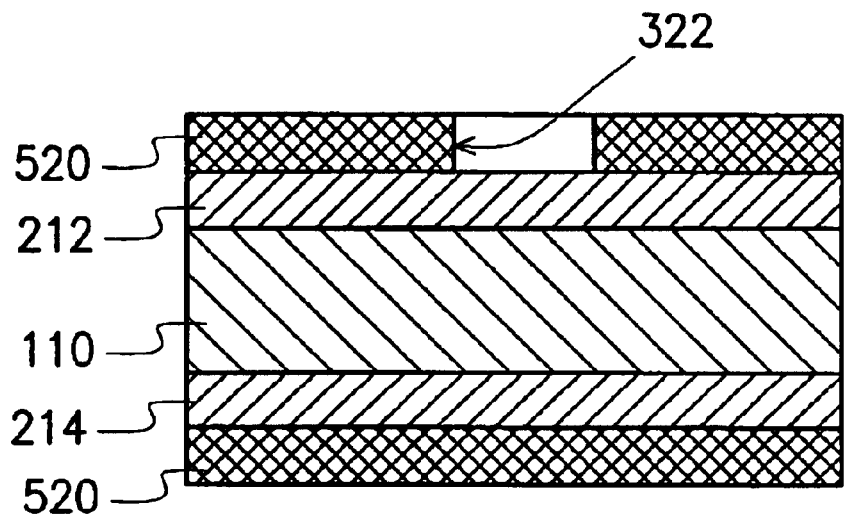
Figure 5C:
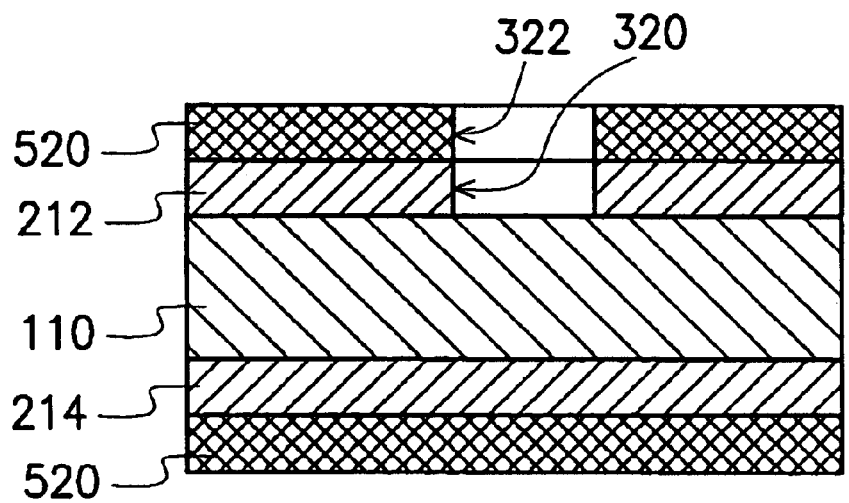
Figure 5D:
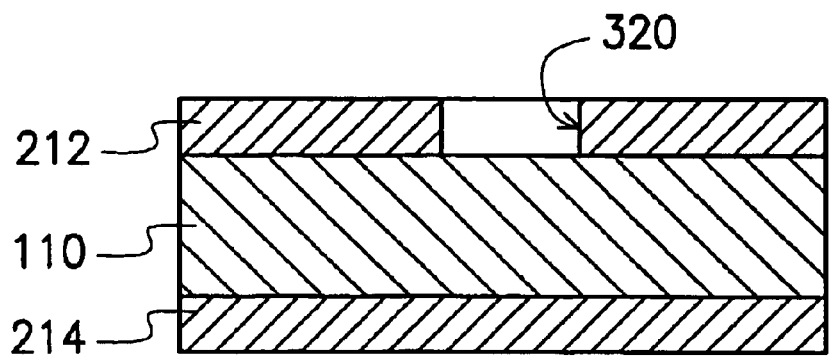
Figure 6:
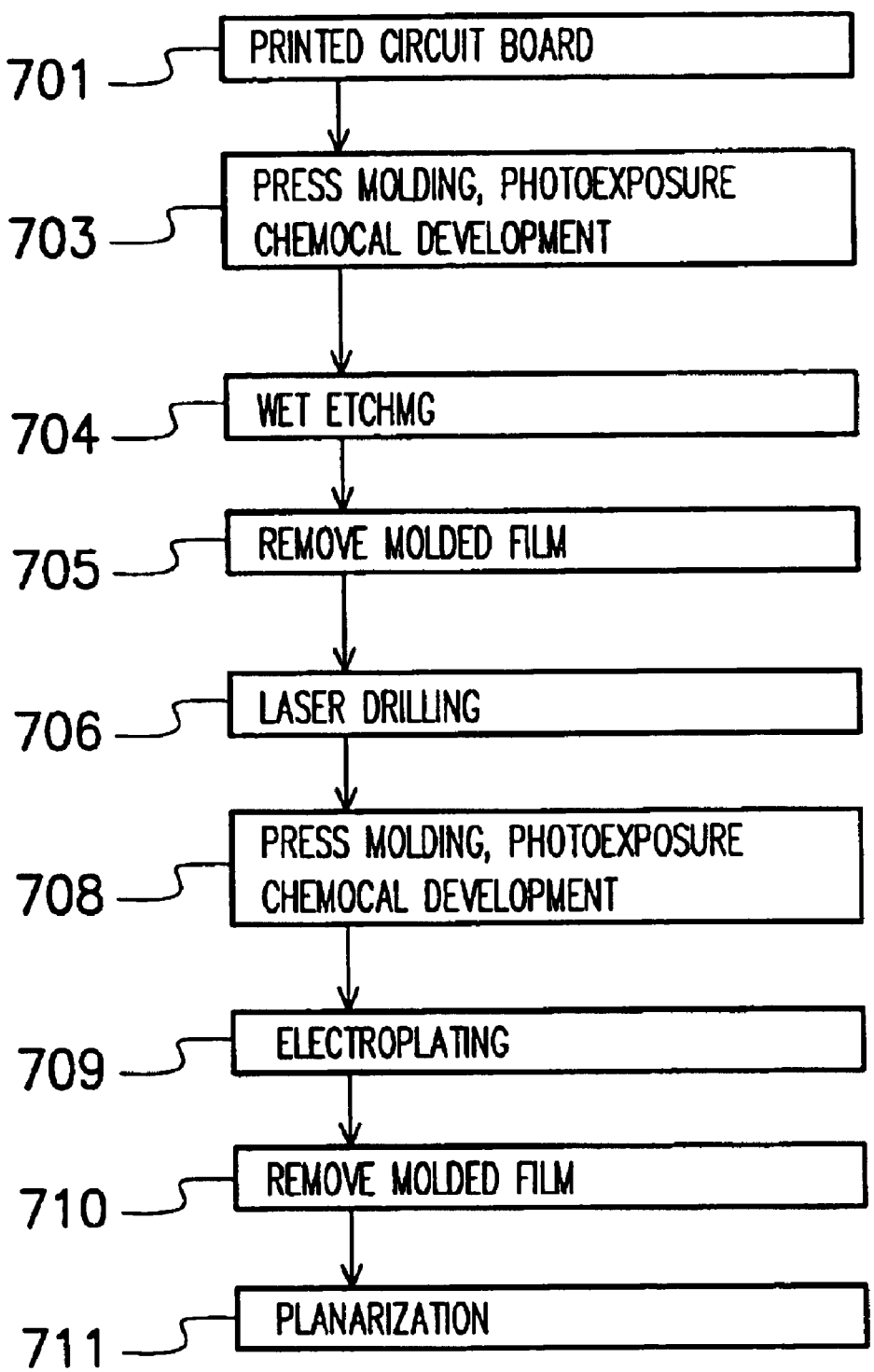
FIG. 6 is a flow chart showing the steps for forming a solid inter-layer conductive rod in a printed circuit board according to one preferred embodiment of this invention.

As shown in FIG. 5b, a first patterned mask layer 520 (step 703 in FIG. 6) is formed enclosing the printed circuit board. The first patterned mask layer 520 has a third opening 322 that exposes a portion of the first conductive layer 212. The first patterned mask layer can be a photoresist or a photosensitive polyimide layer formed, for example, by a dry filming or a wet filming process. As shown in FIG. 5c, the exposed first conductive layer 212 (step 704 in FIG. 6) is removed to form a first opening 320 that exposes a portion of the insulating layer 110. As shown in FIG. 5d, the first patterned mask layer 520 is removed (step 705 in FIG. 6).

Figure 5E:
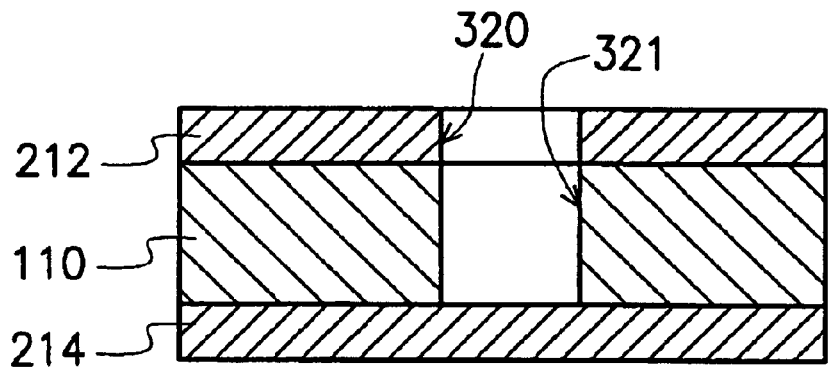
Figure 5F:
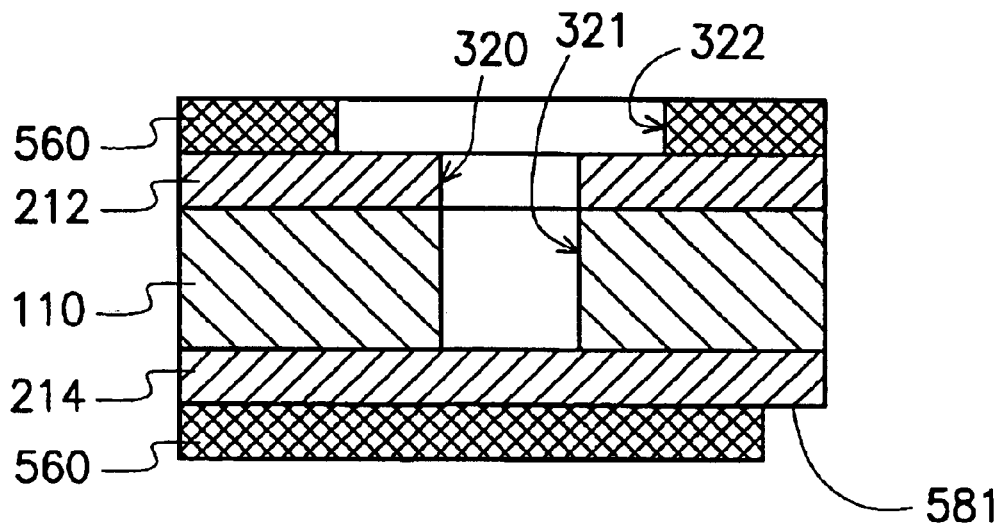

As shown in FIG. 5e, a laser beam or a mechanical drill bit is used to drill (step 706 in FIG. 6) a hole in the exposed insulating core layer 110 so that a second opening 321 is formed. The second opening 321 exposes a portion of the second conductive layer 214. As shown in FIG. 5f, a second patterned mask 560 (step 708 in FIG. 6) is formed enclosing the printed circuit board. The second patterned mask 560 exposes the second opening 321 and an edge portion 581 of the second conductive layer 214. The edge portion 581 of exposed the second patterned serves as an entry point for an electroplating current. The second mask layer 560 can be a photoresist or a photosensitive polyimide layer formed, for example, by a dry filming or a wet filming process.

Figure 5G:
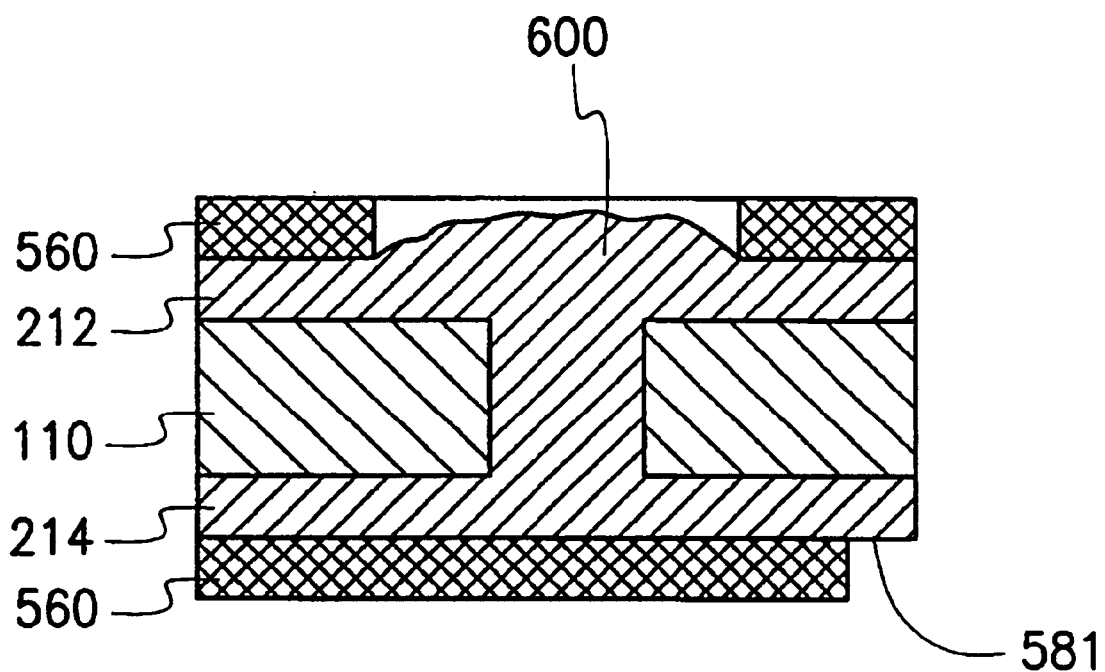
Figure 5H:
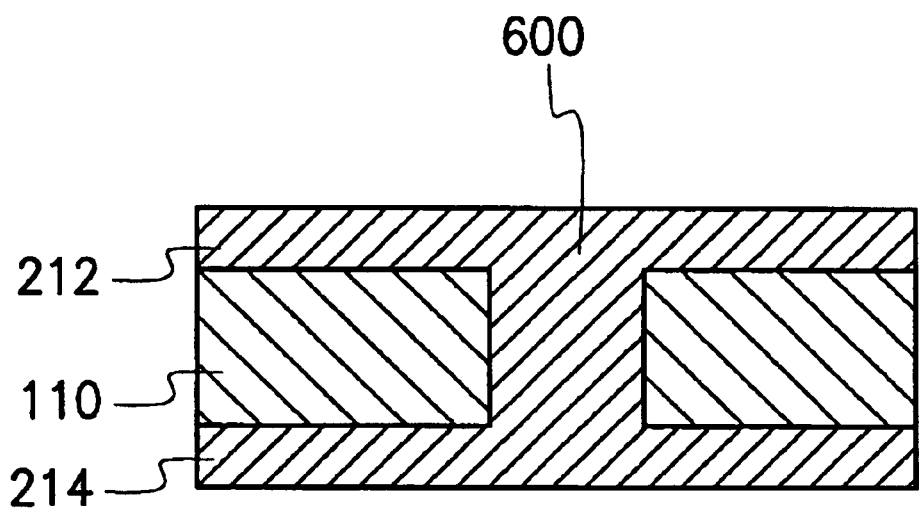

As shown in FIG. 5g, an electroplating process is conducted (step 709 in FIG. 6) using the second conductive layer 214 as a negative electrode. A conductive material fills the first opening 320 and the second opening 321 completely, thereby forming a solid rod 600. The conductive material includes copper, for example. In the electroplating process, some conductive material may protrude into the first opening 320. Hence, in FIG. 5h, the second patterned mask layer 560 (step 710 in FIG. 6) as well as the protruding portion of the plated conductive material (step 711 in FIG. 6) is removed. Finally, both sides of the printed circuit board are planarized by polishing using a sanding machine or a grinding wheel (not shown).

Since the second conductive layer is the only conductive layer connected to the negative electrode during electroplating, plating material accumulates from the second conductive layer. Because plugging of both ends by conductive material due to the application of a negative electrode to both conductive layers is avoided in this invention, a solid conductive rod is formed.

Figure 7:
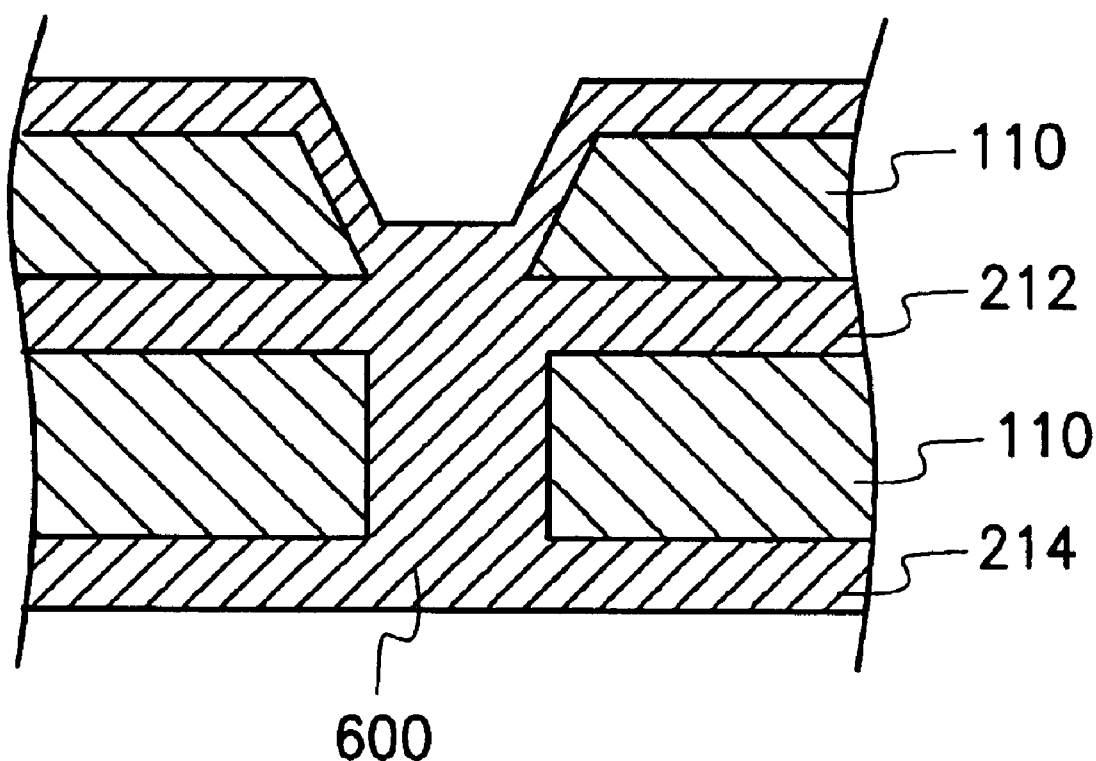
FIG. 7 is a diagram showing the upper area of the solid inter-layer conductive rod shown in FIG. 5h serving directly as a lower conductive pad.

In summary, major advantages of this invention includes the following:

1. Since a solid conductive rod 600 is formed in the printed circuit board, the upper surface of the solid conductive rod can be used as the conductive pad for a lower layer as shown in FIG. 7. There is no need to expand the area of the opening pad or form a connecting patch in a neighboring area to serve as a conductive pad. Hence, area utilization of the printed circuit board is increased.

Figure 8A:
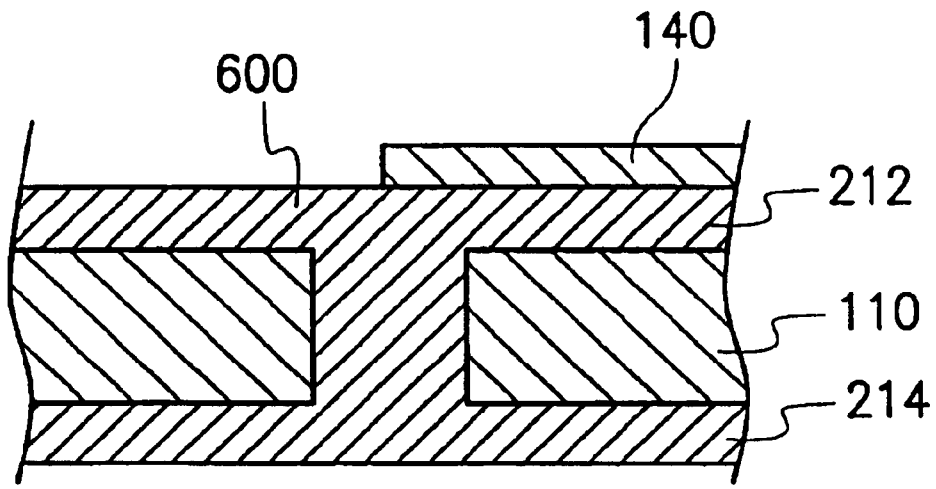
FIGS. 8a and 8b are cross-sectional views showing the connection between a patterned conductive layer and the solid inter-layer conductive rod shown in FIG. 5h after etching in the presence of pattern misalignment.
Figure 8B:
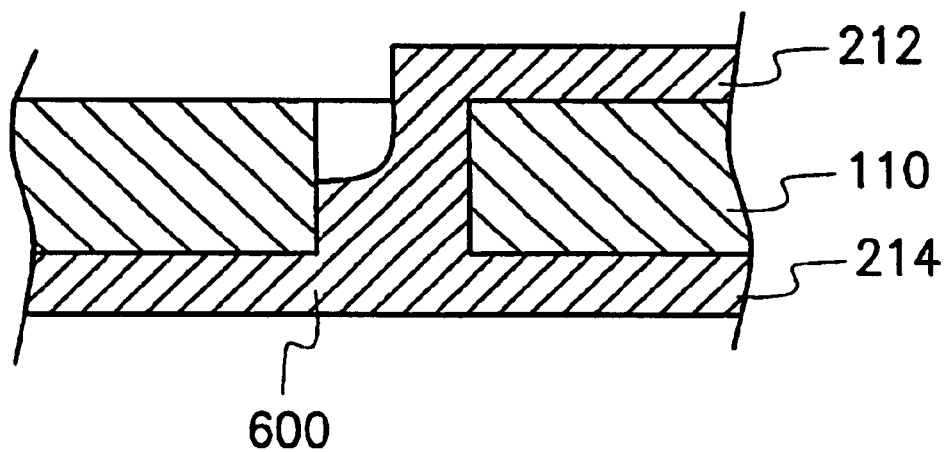

2. A solid conductive rod 600 is formed inside the first and the second opening of the printed circuit board. Hence, any misalignment of opening pad 140 (as shown in FIG. 8a) leading to the destruction of a portion of the solid conductive rod (as shown in FIG. 8b) during subsequent etching has minimal effect on ultimate electrical conductivity. Consequently, a higher product yield is obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a solid conductive rod, comprising:

providing a printed circuit board, wherein the printed circuit board includes an insulating core layer, a first conductive layer and a second conductive layer with the insulating core layer sandwiched between the first conductive layer and the second conductive layer;

forming a first opening in the first conductive layer, wherein the first opening exposes a portion of the insulating core layer;

conducting a drilling operation to remove the exposed insulating core layer and form a second opening, wherein the second opening exposes a portion of the second conductive layer;

forming an electroplating mask to cover exposed surfaces of the first conductive layer and the second conductive layer, wherein the second opening and a portion of the second conductive layer remain exposed;

conducting an electroplating process using the second conductive layer, through the exposed portion, as an electrode to fill the first and the second openings solidly with a conductive material;

removing the electroplating mask; and performing a planarizing process on the first conductive layer to remove a protruding portion of the filled conductive material.

2. The method of claim 1, wherein conducting the drilling operation includes drilling with a laser beam or a drill bit.

3. The method of claim 1, wherein forming the first opening further includes:

forming a first patterned mask layer enclosing the printed circuit board, wherein the first patterned mask layer has a third opening exposing a portion of the first conductive layer; and removing the exposed first conductive layer to form the first opening.

4. The method of claim 3, wherein after forming the first opening, further includes removing the first patterned mask layer.

5. The method of claim 3, wherein material forming the first patterned mask layer is selected from a group consisting of photoresist and photosensitive polymide.

6. The method of claim 1, wherein material forming the electroplating mask is selected from a group consisting of photoresist and photosensitive polymide.

7. The method of claim 1, wherein the material constituting the conductive layers includes copper.

8. The method of claim 1, wherein conductive material includes copper.

9. The method of claim 1, wherein the protruding portion of the filled conductive material is removed by sanding with a sanding machine.

10. The method of claim 1, wherein the protruding portion of the filled conductive material is removed by grinding with a wheel grinder.

11. The method of claim 1, wherein the printed circuit board includes an integrated circuit carrier.

* * * * *